(12) United States Patent
Elian et al.

(10) Patent No.: US 7,005,220 B2
(45) Date of Patent: Feb. 28, 2006

(54) METHOD FOR STRUCTURING A LITHOGRAPHY MASK

(75) Inventors: Klaus Elian, Erlangen (DE); Armelle Vix, Munich (DE)

(73) Assignee: Infineon Technologies AG, (DE)

( * ) Notice: Subject to any disclaimer, the term of this patent is extended or adjusted under 35 U.S.C. 154(b) by 186 days.

(21) Appl. No.: 10/465,103

(22) Filed: Jun. 19, 2003

(65) Prior Publication Data
US 2004/0013952 A1   Jan. 22, 2004

(30) Foreign Application Priority Data
Jun. 26, 2002   (DE) ............................... 102 28 546

(51) Int. Cl.
*G03F 9/00*   (2006.01)
*G03C 5/00*   (2006.01)

(52) U.S. Cl. .......................... 430/5; 430/296; 430/312; 430/313; 430/314; 430/316; 430/330; 430/942

(58) Field of Classification Search .................. 430/5, 430/296, 312, 313, 314, 316, 330, 942
See application file for complete search history.

(56) References Cited

U.S. PATENT DOCUMENTS

| | | |
|---|---|---|
| 5,126,220 A | 6/1992 | Tokitomo et al. |
| 5,242,770 A | 9/1993 | Chen et al. |
| 5,306,601 A | 4/1994 | Hashimoto et al. |
| 5,482,799 A | 1/1996 | Isao et al. |
| 5,821,014 A | 10/1998 | Chen et al. |

*Primary Examiner*—Christopher G. Young
(74) *Attorney, Agent, or Firm*—Schiff Hardin LLP

(57) ABSTRACT

A method for structuring a lithograph mask by forming a cured, electrically-conductive layer on a mask structure having a radiation-transmissive substrate and a mask layer at least in portions of the surface of the radiation-transmissive substrate before applying a resist layer, so that during a subsequent irradiation of the resist layer by means of an electronic printing, the electrically conductive layer ensures a good charge elimination. By using a cured, electrically conductive layer, no intermixing effects between the electrically-conductive layer and the resist layer occur, and the electrically-conductive layer will be stable during subsequent development steps and not stripped off.

15 Claims, 3 Drawing Sheets

METHOD FOR STRUCTURING A LITHOGRAPHY MASK

BACKGROUND OF THE INVENTION

The present invention is directed to a method for structuring a lithography mask.

Because structure dimensions are becoming smaller and smaller for producing LSI semiconductor components, dimensionally true photolithographic transfer of mask structures onto radiation-sensitive resist layers is becoming more and more important. In the meantime, semiconductor components with structure line widths of 180 nm and less are being manufactured in a great volume for commercial employment, so that the demands made of the structuring process steps must meet the highest standards. In addition to the development of improved lithography techniques for the transfer of the mask structure, this also assumes the offering of finer and finer masks. The demands that are made of the structuring of the lithography masks are thus also becoming more strict.

Chrome masks are mainly employed both for proximity exposure as well as for contact exposure. These chrome masks are essentially composed of a silica glass substrate that is also light-transmissive in the UV range and have a thin, light-impermeable layer of black chrome applied onto the substrate. A back-reflection of incident light into the resist layer is minimized by the black chrome, which exhibits a low reflection coefficient.

Despite the widespread employment of wafer steppers with a demagnification factor of 4:1 in the commercial manufacture of semiconductor components, the structures to be imaged onto the masks have become so small in the meantime that the laser pencils that are currently still in widespread use must be increasingly replaced by electron beam printers, and, accordingly, the mask structures must be generated with electron beam lithography.

To that end, a resist layer is applied on the layer of black chrome on the mask blank and this is subsequently designationally exposed with an electron beam. As a result of the exposure, the resist is chemically modified so that the exposed regions comprise a different solubility in certain developer solutions compared to the unexposed regions. The solubility of the resist can be either raised or lowered by the exposure. When the solubility is raised, this is referred to as a positive resist, and the exposed regions are removed in the subsequent development of the resist. Analogously, a negative resist has the exposed regions of the resist remain on the mask blank. In an etching following the development of the resist, the chrome layer is removed in the regions that are no longer protected by the resist and, thus, the radiation transmissive regions of the mask are generated.

The employment of electron beam lithography is also essentially necessitated by new methods for the correction of what are referred to as "proximity effects". What are understood by "proximity effects" are diffraction and interference effects of the mask structures that lie close to one another. These can lead to a noticeable deterioration of the obtainable dimensional accuracy. The proximity effects are all the more pronounced when the structures lie closer to one another. This, for example, results when structures that should actually have the same size are differently imaged into the resist layer dependent on their respective environment. This difference will appear especially clear between structures that are very densely arranged and structures that are largely isolated without neighboring structures.

In order to largely compensate for this difference, auxiliary structures—what are referred to as "scattering bars" or SRAF=sub-resolution assist features"—are usually employed, and are arranged in the proximity of the isolated structures. Accordingly, a structure that is actually isolated now has an environment that largely corresponds to the environment of the densely arranged structures, so that essentially the same imaging properties occur.

These auxiliary structures are thereby fashioned on the mask so that they themselves are not imaged into the resist layer, and they are respectively arranged parallel to the edges of the actual structures on the mask. Auxiliary structures of this type are disclosed, for example, in U.S. Pat. Nos. 5,242,770 and 5,821,014, whose disclosures are incorporated herein by reference thereto. These auxiliary structures are significantly smaller than the structure elements to be imaged and, as a result whereof stricter demands are made of the lithographic precision in the mask printing.

Another method for improving the photolithographic transfer of mask structures onto a substrate is the employment of what are referred to as phase masks, particularly "alternating phase masks" or ALT PSM for Alternating Phaseshift Mask. In contrast to standard chrome masks or COG for Chrome On Glass, two different transparent regions are generated in these masks. For example, this can occur in that, following the etching of the chrome layer on the mask blank, a part of the radiation-transmissive regions are provided with a phase boost by means of a designational etching compared to the respectively neighboring, radiation-transmissive regions in a second, following lithographic process so that a predefined phase difference is achieved between two respectively neighboring, radiation-transmissive regions. This phase difference will usually amount to 180°. An increase in the structure resolution of up to a factor of 2 compared to the traditional technique can be achieved by applying this technique given highly periodic, lattice-like structures.

The phase mask technique makes particular demands of the mask fabrication since additional layers are thereby applied or, respectively, the substrate must be eroded in defined fashion in order to achieve the desired interference effect. The manufacture of an "alternating phase mask" usually requires two separate lithography steps. The chrome layer of the mask is structured in the first lithography step. The charging of the mask observed given the employment of an electron beam printer does not yet represent a problem in this first step since the charge can be unproblematically dissipated by means of a suitable grounding of the continuous chrome layer of the mask blank.

In the second lithography step, the pre-structured chrome layer is coated anew with a resist, which must then likewise be inscribed, i.e. exposed. In this second step, the employment of an electron beam printer represents a problem because the chrome layer is interrupted by the structuring and, thus, a surface-wide elimination of the charge by grounding the chrome layer is no longer possible. As a result thereof, the pre-structured mask blank is negatively charged during the electron printing.

This negative charging influences the electron beam incident onto the mask blank during electron printing, because the electron beam is employed both for the writing, i.e. exposure, as well as for alignment monitoring. The interaction of the electron beam with the negative charge of the mask blank leads to an undesired deflection and spread of the electron beam, and will result in a disturbance of the alignment monitoring as well as distortions and writing errors when writing the second lithography level of the phase mask occur. This problem, which is also referred to as "charging", currently complicates or, respectively, prevents the use of electron printers for the second lithography level in phase masks, so that optical mask printers are currently still utilized for this second step.

In order to be able to optimally utilize the phase mask technique, however, it is necessary that the phase-shifted radiation-transmissive regions of the mask are generated with at least the same precision as the structures generated by the first chrome etching. New methods with which this could be achieved should not, however, further lengthen the writing time of the mask, since the overall economic feasibility of the manufacturing process of the integrated circuit would be diminished as a result of the increased writing time. This must always be additionally taken into consideration in the development of new lithographic methods, and it is especially desirable for the writing time to be shortened further by means of the improved lithographic processes.

Previous approaches to solving the "charging" problem provide for the application of additional, electrically conductive lacquer structures on the pre-structured mask blank and are schematically shown in FIG. 1 as well as FIGS. 2A and 2B. The additional lacquer layers are usually composed of organic, electrically conductive components that are additionally selected so that they are water soluble. The water solubility of the electrically conductive layer is critical in order to thus avoid what are referred to as "intermixing" effects between the electrically conductive layer and the resist layer that is employed. Both the resist layer as well as the electrically conductive layer are applied by spin-on deposition onto the substrate. To this end, a solution of the respective lacquer components is applied onto the substrate during a fast rotation thereof, so that a thin surface film of the solution is formed on the substrate. Subsequently, the remaining solvent is eliminated from the spun-on layer. When a water-insoluble, electrically conductive layer is employed that is applied in the immediate proximity of a water soluble resist, then the solvent of the topmost applied layer in turn dissolves the layer lying thereunder that is already solid, so that no sharp boundary surfaces occur between the resist layer and the electrically conductive layer. This leads to an unsharpness in the later development of the resist.

In the approach shown in FIG. 1, an electrically conductive layer 16 is applied as an uppermost layer over the resist layer 14 for eliminating charges. FIG. 1 shows a substrate 10 of silica glass on which a pre-structured black chrome layer 12 has already been applied. A resist layer 14 was applied over the black chrome layer 12, and a water soluble, electrically conductive layer 16 is subsequently applied on the resist layer 14. The layer 16 additionally comprises an adequate transparency in order to allow a subsequent electron beam printing of the resist layer 14. This approach offers the advantage that the water soluble, electrically conductive layer 16 can be unproblematically eliminated in a wet-chemical step after the electron printing. However, the charge elimination is deficient given this layer sequence since the contact between the electrically conductive layer 16 and the substrate 10 or, respectively, the black chrome layer 12 is poor and a capacitor effect is generated due to the resist layer 14.

An alternative approach is shown in FIGS. 2A and 2B. In this approach, the electrically conductive layer 16 is applied directly onto the substrate 10 and the pre-structured black chrome layer 12, and the resist layer 14 is subsequently applied on the electrically conductive layer 16. After the electron printing of the resist layer, as indicated by arrows 100, this is wet-chemically developed.

Although the charge elimination given this layer arrangement is significantly improved compared to the version shown in FIG. 1, the problem does exist here that a pronounced undermining of the resist layer occurs in the development of the resist layer 14 due to an isotropic erosion of the water soluble, electrically conductive layer 16. As a result thereof, the dimensional precision with which the structure predefined by the electron printing is transferred into the substrate 10 or, respectively, the black chrome layer 12 is deteriorated in the subsequent etching step. This is shown in FIG. 2B. Given very small structures within the mask, the undermining of the resist can lead to these structures being completely washed away in the development. This is especially problematical given the structuring of masks with a plurality of auxiliary structures.

SUMMARY OF THE INVENTION

The present invention is therefore based on the object of offering a method for manufacturing a lithography mask that alleviates or, respectively, entirely avoids the described problems.

This object is achieved by a method for structuring a lithography mask which comprises the following steps:

a) preparing a mask substrate comprising a radiation-transmissive substrate as well as at least one radiation-impermeable layer and/or half-tone layer applied on the radiation-transmissive substrate at least in a partial region;

b) applying at least one curable, electrically conductive layer over the radiation-impermeable layer and/or the half-tone layer and, potentially, the radiation-transmissive substrate;

c) curing the curable, electrically conductive layer, as a result whereof this layer becomes essentially insoluble;

d) applying a resist layer on the cured, electrically conductive layer;

e) irradiating the resist layer by means of electron printing;

f) developing the resist layer and, as a result whereof partial regions of the resist layer are removed;

g) removing the cured, electrically conductive layer from the regions that are no longer covered by the resist layer; and h) structuring the radiation-impermeable substrate and/or the radiation-impermeable layer and/or the half-tone layer in the regions no longer covered by the resist layer and the cured, electrically conductive layer.

The inventive method offers a number of critical advantages. The electrically conductive layer is arranged under the resist layer and can thus assure a good charge elimination. No intermixing effects between the electrically conductive layer and the resist layer occurs due to the curing process of the electrically conductive layer. In addition, the electrically conductive layer remains stable during the development step and is not stripped off. Only the resist layer is developed and, thus, structured without the undermining problems occurring in the Prior Art.

All advantages of chemically augmented photoresists (CAR) that are already commercial or being newly developed can be utilized without having to consider the specific properties of the electrically conductive layer. Due to the curing, the electrically conductive layer is essentially neutral in behavior. The structuring process required for the structuring of the electrically conductive layer is already usually required in mask manufacture for the subsequent mask structuring. In the context of this process, the electrically conductive layer can be etched first and the mask can be etched subsequently—preferably in one and the same working cycle—by simple modification of, for example, an etching process upon superimposition of an additional step.

What is to be understood by half-tone layer in the context of the present invention is a layer that is radiation-transmissive to a certain percentage that shifts the phase of the radiation that has passed through it by a predefined amount. At least one $MoSi_zO_xN_y$ layer is preferably employed therefor.

In a preferred embodiment of the inventive method, the radiation-transmissive substrate is a substrate of silica glass. In a preferred embodiment, this substrate, which comprises a topside and an underside, is preferably completely or partially coated on one of the two sides with at least one radiation-impermeable layer and/or half-tone layer.

In a preferred embodiment of the inventive method, the radiation-impermeable layer is a chrome layer, preferably a black chrome layer. For example, commercially available "chrome on glass" mask blanks can be employed as mask substrates in the present method, i.e. silica glass panes with a sputtered-on or vapor-deposited chrome layer. A combination of a plurality of different layer can also be employed as radiation-impermeable layer.

In a further version of the inventive method, the radiation-impermeable layer or, respectively, half-tone layer is pre-structured. This will usually be the case when the inventive method is employed for structuring an "alternating phase mask".

In another preferred version of the method, the curable, electrically conductive layer and/or the resist layer is applied by spin-on. A person skilled in the art is notoriously familiar with this technique, so that a discussion of this method can be foregone here. The curable, electrically conductive layer is preferably dried before the curing in a first drying step, i.e. the solvent still present in the layer after the application thereof is essentially completely removed from the layer. This can ensue, for example, by heating the electrically conductive layer to a first temperature $T_1$. For example, the curable, electrically conductive layer can be heated to 100° C. for 120 seconds. The degree of the temperature $T_1$, which preferably is in a range between 70° C. and 170° C., the duration of the first drying step and a temperature gradient to be potentially adhered to are to be adapted to the solvent and the layer materials that are employed.

For example, materials that contain one or more constituents that produce the electrical conductivity in the cured layer in addition to a curable carrier polymer and auxiliary constituents can be employed as curable, electrically conductive layers. For example, a novolak carrier polymer together with a crosslinking auxiliary component such as, for example, melamine and—optionally—with a photo or thermal acidifier as a catalyst can be utilized. Short-chain, partially oxidized polythiopene units, for example as a polymer side chains, can be utilized as constituents that produce the electrical conductivity. In addition, polypyrroles, polyanilines and/or nahpthalines can be utilized. In general, systems with pronounced π-electron systems can be utilized. Various methods can be applied for curing the electrically conductive layer.

In an especially preferred version of the inventive method, the electrically conductive layer is thermally cured. Other methods, however, are likewise conceivable; thus, for example, curing by irradiation with light of a suitable wavelength. Thermal curing, however, is especially preferred in the context of the present invention since it is especially simple to accomplish in terms of the required apparatus. Dependent on the curing mechanism, the curable, electrically conductive layer contains reactive groups that produce a chemical modification in the layer under the curing conditions as a result whereof the layer is essentially insoluble after the curing. For example, the curable, electrically conductive layer can comprise a carrier polymer with thermally crosslinkable functional groups that produce a crosslinking of the carrier polymer and, thus, the desired reduction in solubility.

The temperature, curing duration as well as a temperature gradient to be potentially adhered to that are to be observed in the thermal curing are to be adapted to the respectively employed chemical constituents of the electrically conductive layer. The temperature thereby preferably is in a range between 180° C. and 300° C. given a preferred curing duration in a range between 60 seconds and 720 seconds. For example, the curing can ensue at 235° C. over 120 seconds. The chemical stability of the electrically conductive layer can also be increased by the curing, so that it behaves in an essentially chemically inert fashion relative to the materials of the resist layer; for example, it does not chemically react with these materials.

The resist layer is applied after the curing of the electrically conductive layer. All conceivable resist materials suitable for the exposure by electron printers can be employed as the resist layers. Suitable resist materials are familiar to a person skilled in the art and are commercially available. Both positive resists as well as negative resists can thereby be utilized.

In another preferred embodiment of the inventive method, the resist layer is dried in a second drying step before the electron printing. This second drying step likewise serves for the removal of solvent that may still be potentially present in the resist layer. Duration and temperature $T_2$ as well as a temperature gradient to be potentially adhered to in the second drying step are likewise to be adapted to the solvent employed and to the resist material. The temperature $T_2$ thereby preferably is in a range between 60° C. and 160° C. given a preferable duration in a range between 60 seconds and 720 seconds. For example, the resist can be dried at 120° C. for 120 seconds.

The exposure of the resist layer in the inventive method ensues by means of electron printing. Traditional methods and devices can be utilized therefor, for example a traditional electron mask printer of the MEBES type (Mask Electron Beam Exposure System), for example from the ETEC-MEBES series. These methods and devices are familiar to a person skilled in the art and need no further explanation here.

After the electron printing, the resist layer is thermally treated in a preferred version of the inventive method in order to fix the latently inscribed image. To that end, the resist layer is heated to a specific temperature over a suitable time span or, respectively, is exposed to a specific temperature or a temperature gradient in what is referred to as a "post-exposure bake".

Traditional methods and materials are likewise utilized for developing the resist. For example, the development can ensue by means of a basic alkaline solution in which either the exposed or unexposed regions of the resist are soluble. The employment of a solution of 2.38 weight-% tetramethyl ammonium hydroxide in water is especially preferred as a developer solution.

"Intermixing" effects are avoided by employing the curable, electrically conductive layer, which is essentially insoluble after the curing, since the cured electrically conductive layer can no longer be dissolved by the solvent potentially employed in the application of the resist layer. Due to its insolubility, the cured electrically conductive layer also remains uninfluenced in the development of the resist layer and, as a result whereof the undermining problems occurring given the employment of water soluble electrically conductive layers are avoided, and, thus, the transfer precision of the desired structure into the mask is improved.

What is to be understood by "essentially insoluble" in the context of the present invention is that the cured electrically conductive layer comprises so little solubility in all solvents ordinarily employed in mask structuring methods that it remains completely or at least essentially unchanged given contact with these solvents. Solvents that are usually employed, for example, are ethyl acetate, cyclohexanone, cyclopentanone, γ-butyrolactone, methylethylketone or methoxypropylacetate as well as alkaline or acidic developer solutions.

An additional advantage of the inventive solution is that a good dissipation of the charging of the mask substrate, which charging is generated during electron printing, is achieved due to the direct contact of the electrically conductive layer with the radiation-impermeable layer and/or the radiation transmissive substrate. In that the electrically conductive layer is essentially insoluble and chemically stable relative to the resist after the curing, compatibility problems between resist and electrically conductive layer are avoided. All advantages of resists that are already available such as, for example, chemically augmented resists or that are still to be developed can thus be exploited in the inventive method.

What the insolubility of the cured electrically conductive layer causes is that this layer, in contrast to the methods known from the Prior Art, is present unmodified after the developing and must therefore be removed in an additional step before the structuring of the radiation-impermeable layer and/or of the radiation transmissive substrate. This, however, can be accomplished in an especially easy way and without additional apparatus outlay. According to a preferred embodiment of the present invention, this occurs in that the cured, electrically conductive layer is removed in method step g) by means of a plasma etching, preferably an oxygen ion plasma etching.

In another preferred embodiment of the present invention, the structuring of the radiation-impermeable layer and/or of the radiation transmissive substrate occurs by means of a plasma etching, preferably an ion plasma etching, in method step h) following the removal of the cured, electrically conductive layer. This shows that the employment of the cured electrically conductive layer instead of a water soluble electrically conductive layer as usual leads to no time-consuming complication of the method, since the two etchings can be unproblematically implemented immediately after one another in the same plasma reactor. Despite the additional etching step, thus, the mask printing time is kept short.

According to another preferred embodiment of the inventive method, the resist layer and the cured, electrically conductive layer are removed from the mask substrate in at least one additional method step i) after the structuring of the radiation-impermeable layer and/or of the radiation transmissive substrate in method step h). When both layers are essentially composed of organic compounds, this can preferably ensue be incineration of the two layers, which in turn means only a minimal apparatus outlay and thus likewise has a positive influence on the printing time of the mask. As an alternative, these layers can also be wet-chemically removed with highly alkaline reaction mixtures such as, for example, concentrated amine mixtures.

The invention is presented in greater detail below on the basis of the Figures as well as the example.

DESCRIPTION OF THE PREFERRED EMBODIMENTS

Figure 1:
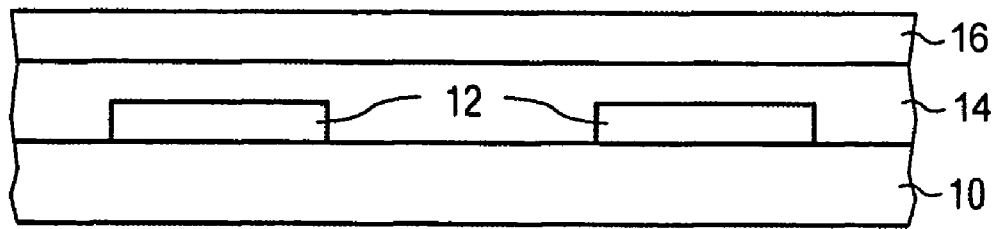
FIG. 1 shows a method step of a method for structuring a black chrome mask.
Figure 2A:
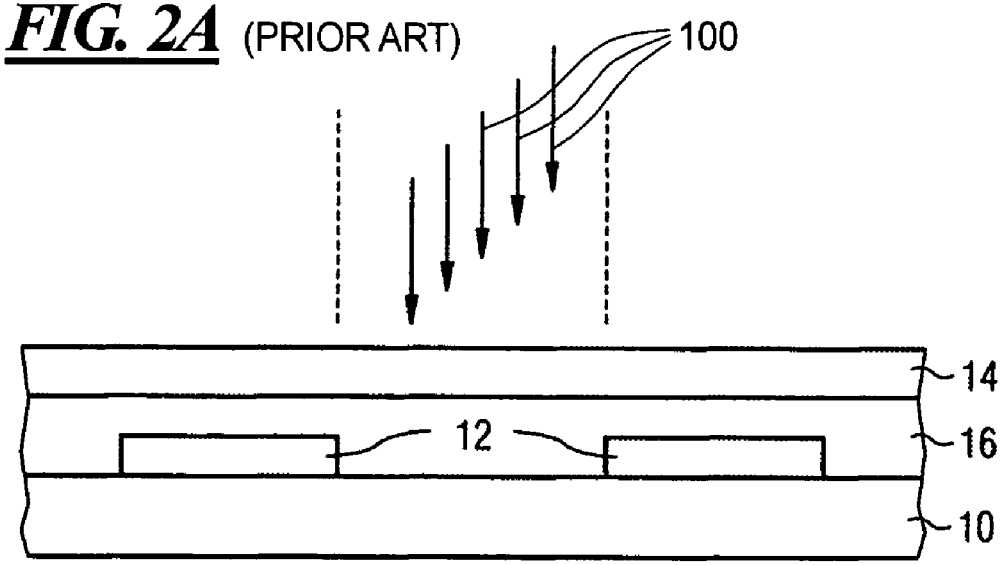
FIGS. 2A and 2B show method steps of another method for structuring a black chrome mask.
Figure 2B:
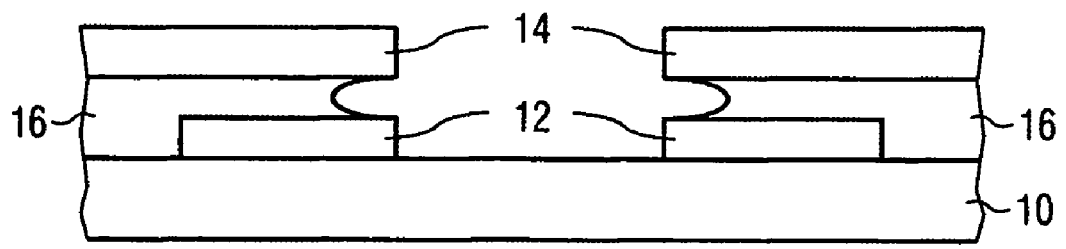
Figure 3A:
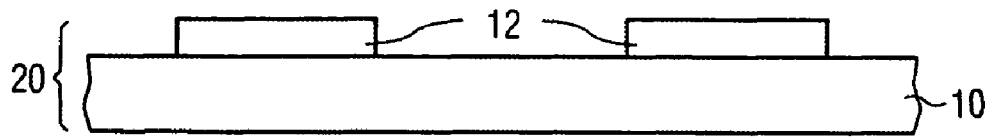
FIGS. 3A–3H illustrate method steps of a preferred embodiment of the inventive method.

The preferred embodiment of the inventive method shown in FIGS. 3A through 3H schematically shows the structuring of a pre-structured mask blank, for example a commercially available 6-inch COG mask blank, for the manufacture of an "alternating phase mask". FIG. 3A shows a mask substrate 20 composed of a quartz substrate 10 on whose upper surface a pre-structured black chrome layer 12 is applied. A curable, electrically conductive layer 18 is applied by spin-on over the black chrome layer 12 and the uncovered regions of the substrate 10.

The curable, electrically conductive layer 18 comprises a thermally curable carrier polymer, auxiliary constituents for layer formation, for example solvents, as well as at least one constituent that produces the electrical conductivity in the cured layer 18.

Figure 3B:
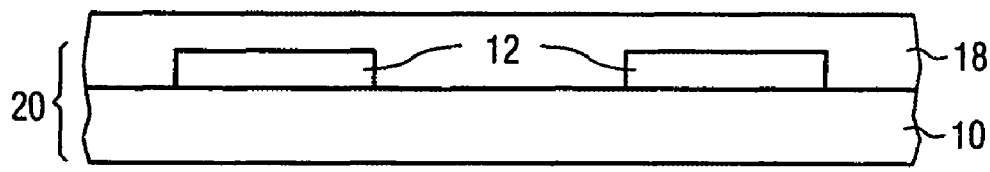

The curable, electrically conductive layer 18 is dried at 100° C. for 120 seconds in a first drying step, whereby a majority of the solvent employed for the spin-on evaporates and the solid, dry layer 18 is thus formed that comprises a layer thickness of about 0.3 µm (FIG. 3B). The dried layer 18 is subsequently cured. To that end, the layer is heated to 235° C. for 120 seconds. The chemical modification of the electrically conductive layer 18 occurs at this temperature, and the layer becomes essentially insoluble as a result of this treatment.

Figure 3C:
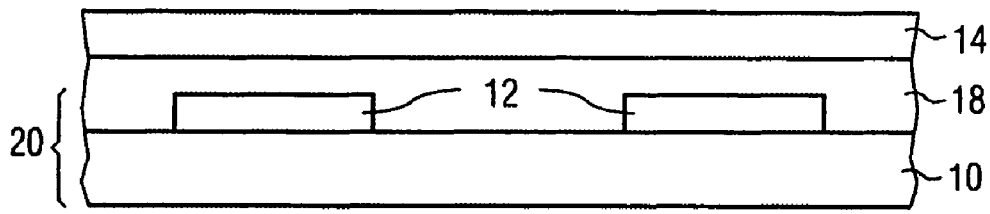
Figure 3D:
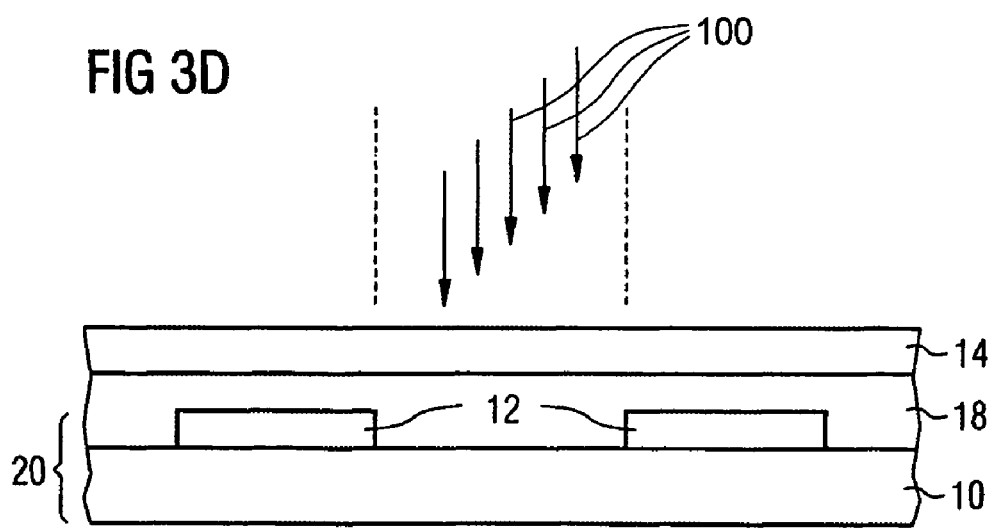

After the curing, the resist layer 14 is spun onto the cured, electrically conductive layer 18 and is dried at 120° C. for 120 seconds in a following, second drying step. The resulting, dried resist layer 14 comprises a layer thickness of approximately 0.2 µm (FIG. 3C). The resist layer 14 is subsequently exposed with an electron printer in selected regions. This is schematically indicated in FIG. 3D by the incident arrows 110. Since the electrically conductive layer 18 is in direct contact with the mask substrate 20, the charge generated on the substrate during the electron printing can be dissipated, so that no printing errors or imprecisions or, respectively, alignment errors occur due to interactions between the charged substrate and the electron beam. After the exposure, the image latently produced in the resist layer 14 is thermally fixed in the "post-exposure bake".

Figure 3E:
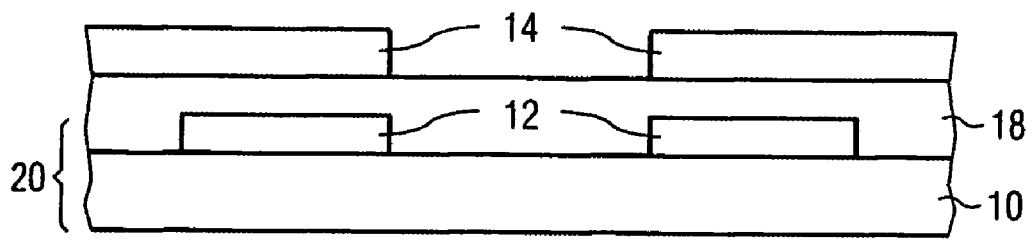

After the fixing, the resist layer 14 is developed by means of a 2.38 weight-% solution of tetramethyl ammonium hydroxide, as a result whereof the previously exposed regions of the resist layer 14 are removed (FIG. 3E). Since the cured, electrically conductive layer 18 residing under the resist layer 14 is insoluble in the developer solution, no undermining of the resist layer 14 occurs during developing.

Figure 3F:
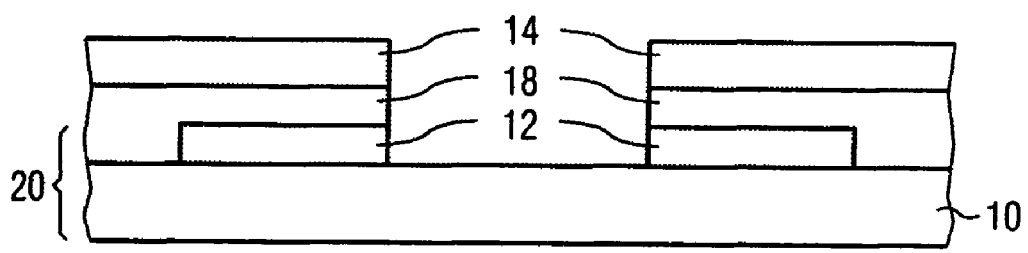
Figure 3G:
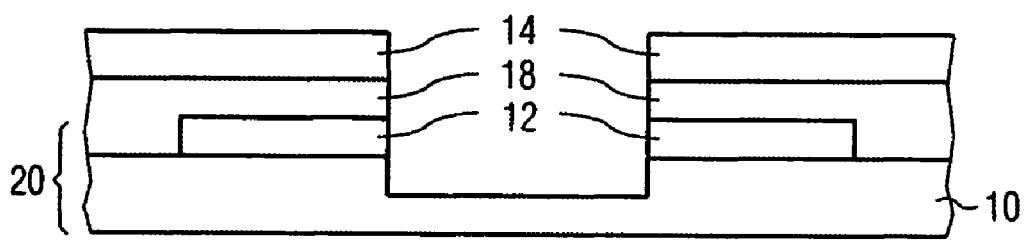
Figure 3H:
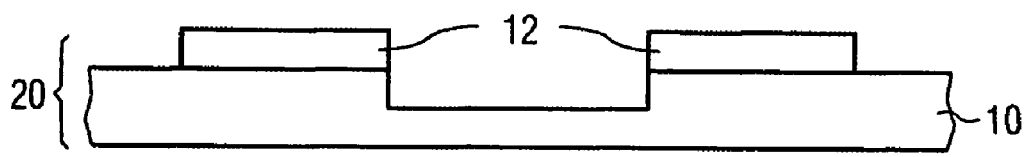

After the developing, the cured, electrically conductive layer 18 is etched with an oxygen ion plasma in what are now the uncovered regions, so that the substrate 10 is uncovered in these regions (FIG. 3F). The plasma etching can be implemented in a traditional plasma reactor. After the etching of the electrically conductive layer 18, the plasma gas is changed and an ion etching of the quartz substrate 10 in what are now the uncovered regions is subsequently implemented in the same plasma reactor. This etching, for example, can be implemented with fluorine-containing etching gasses such as, for example, $C_2F_6$ at 4 mTorr, a mixture of 53% Ar and 47% $CF_4$ at 2.5 Torr, a mixture of 6% $CF_4$, 80% Ar and 14% $C_3F_8$ or with $C_4F_8$ at 0.2 mTorr. As a result of this etching, the layer thickness of the quartz substrate is reduced in the etched region, as a result whereof a phase boost is produced compared to the neighboring, unetched regions of the quartz substrate (FIG. 3G). Finally, the cured, electrically conductive layer 18 and the resist layer 14 are in turn removed from the structured mask substrate 20 by incineration.

Another especially preferred embodiment of the inventive method is described below. The curable, electrically conductive layer can be obtained by spin-on of a solution on the substrate, for example a commercially available 6-inch COG mask blank. This solution is produced in the following way: 49.5 g novolak solution SPN400 of the Clariant company are laced with 1 g terthiopene of the Aldrich company. 49.5 g of a 4 weight-% solution of water-free $FeCl_3$ in tetrahydrofurane are added to this mixture, and the solution obtained in this way is thoroughly blended for 30 minutes on a mechanical shaker. In order to apply the curable, electrically conductive layer on the substrate, the solution can be spun onto the substrate given, for example, a rotational speed of 4000 rpm and a rotational duration of 20 s.

In order to cure the layer obtained in this way, the layer can be subjected to a curing step at 160° C. for 300 seconds. A majority of the solvent evaporates during this curing step and the layer cures. A dry, solid lacquer film with a layer thickness of 0.5 µm is obtained.

The layer obtained in this way can be subsequently lacquered with a suitable resist layer. To that end, a chemically augmented e-beam resist, for example the Ebeamresist FEP171 of the Fuji company, is applied onto the cured, electrically conductive layer.

The mask blank obtained in this way can be inscribed with an electron beam. To that end, the resist layer is printed with an electron beam mask printer, for example from the ETEC-MEBES series, or with a Jeol/Nanobeam system at 40 keV.

After the printing, the latently printed image can be fixed in the resist layer. To that end, the mask blank and, thus, the inscribed resist layer is heated in a further heating step, what is referred to as the post-exposure bake, for example at 130° C. for 200 seconds.

Subsequently, the inscribed resist layer can be developed. To that end, the mask blank is treated, for example, for 60 seconds with an aqueous alkaline developer solution, for example a 2.38% tetramethyl ammonium hydroxide solution in water. The inscribed region of the photoresist is dissolved and removed during the development step.

Subsequently, the cured electrical layer can be structured. To that end, the mask blank is held in a pure oxygen plasma for 30 seconds given an oxygen flow rate of 30 sccm in an etching apparatus, for example in an MIE 720 of the MRC company, as a result whereof, the cured, electrically conductive layer is etched in the uncovered regions.

Traditional etching methods normally employed for structuring black chrome masks and half-tone layers can be employed for the subsequent structuring of the chrome or, respectively, silica glass layer or half-tone layers.

Although various minor modifications may be suggested by those versed in the art, it should be understood that we wish to embody within the scope of the patent granted hereon all such modifications as reasonably and properly come within the scope of our contribution to the art.

We claim:

1. A method for structuring a lithographic mask comprising the sequential steps of:

preparing a mask substrate comprising a radiation-transmissive substrate having a mask layer in at least partial regions, said mask layer being selected from a group consisting of a radiation-impermeable layer, a half-tone layer and a combination of a half-tone layer and a radiation-impermeable layer;

applying at least one curable electrically-conductive layer over the mask layer and exposed portions of the radiation-transmissive substrate;

curing the curable, electrically-conductive layer so that it becomes essentially insoluble;

applying a resist layer on the cured, electrically-conductive layer;

electron printing the desired patterns on the resist layer;

developing the resist layer to remove partial regions of the resist layer;

removing the cured, electrically-conductive layer in those regions that are no longer covered by the resist layer; and structuring exposed portions of the radiation-impermeable substrate and the mask layer which are no longer covered by the resist layer and the cured electrically-conductive layer.

2. A method according to claim 1, wherein the radiation-transmissive substrate is composed of silica glass.

3. A method according to claim 2, wherein the mask layer is a radiation-permeable layer comprised of a chrome layer.

4. A method according to claim 1, wherein at least one of the steps of applying the curable, electrically-conductive layer and the resist layer is a step of spinning the layer onto the mask substrate.

5. A method according to claim 1, wherein the step of curing the curable, electrically-conductive layer is by a thermal curing.

6. A method according to claim 1, which includes, before curing the curable, electrically-conductive layer, applying a first drying step to remove solvent from the material.

7. A method according to claim 6, which includes, prior to the step of irradiating, performing a second drying step to remove solvent from the resist layer.

8. A method according to claim 1, which includes thermally fixing the exposed resist layer before the step of developing.

9. A method according to claim 1, wherein the step of developing utilizes an aqueous, alkaline developer solution.

10. A method according to claim 1, wherein the step of developing utilizes a solution of 2.38 weight % tetramethyl ammonium hydroxide in water.

11. A method according to claim 1, wherein the step of removing portions of the cured, electrically-conductive layer utilizes a plasma etching.

12. A method according to claim 11, wherein the step of removing exposed portions of the mask substrate utilizes a plasma etching.

13. A method according to claim 12, wherein the plasma etching for removing the exposed portions of the mask substrate is an ion plasma etching.

14. A method according to claim 13, wherein the plasma etching for removing the electrically-conductive layer is an oxygen ion plasma etching.

15. A method according to claim 1, which includes, subsequent to structuring the mask substrate, removing the remaining resist layer and cured, electrically-conductive layer.

* * * * *